(12) United States Patent  
Bez et al.

(10) Patent No.: US 7,772,084 B2  
(45) Date of Patent: Aug. 10, 2010

(54) PROCESS FOR SELF-ALIGNED MANUFACTURE OF INTEGRATED ELECTRONIC DEVICES

(76) Inventors: Roberto Bez, Via Vespri Siciliani, 2, Milano (IT) 20146; Alessandro Grossi, Via Lario, 8, Milano (IT) 20159

( * ) Notice: Subject to any disclaimer, the term of this patent is extended or adjusted under 35 U.S.C. 154(b) by 168 days.

(21) Appl. No.: 12/006,706

(22) Filed: Jan. 4, 2008

(65) Prior Publication Data  
US 2008/0108200 A1    May 8, 2008

Related U.S. Application Data

(62) Division of application No. 10/713,538, filed on Nov. 14, 2003, now Pat. No. 7,468,535.

(30) Foreign Application Priority Data

Nov. 15, 2002  (IT) .......................... TO2002A0997

(51) Int. Cl.  
*H01L 21/76* (2006.01)

(52) U.S. Cl. ................ 438/425; 257/E21.545

(58) Field of Classification Search ................ 438/425; 257/E21.545  
See application file for complete search history.

(56) References Cited

U.S. PATENT DOCUMENTS

| 5,449,636 | A | 9/1995 | Park et al. |
| 6,090,661 | A | 7/2000 | Perng et al. |
| 6,362,071 | B1 | 3/2002 | Nguyen et al. |
| 6,373,083 | B1 | 4/2002 | Oh |
| 6,403,421 | B1 * | 6/2002 | Ikeda et al. .................. 438/267 |
| 6,420,749 | B1 | 7/2002 | Divakaruni et al. |
| 6,448,606 | B1 * | 9/2002 | Yu et al. ...................... 257/315 |
| 6,649,965 | B2 * | 11/2003 | Takada et al. ................ 257/314 |
| 6,696,742 | B2 | 2/2004 | Deml et al. |
| 6,794,708 | B2 | 9/2004 | Mori |
| 6,989,303 | B2 | 1/2006 | Mori |
| 7,170,786 | B2 * | 1/2007 | Chien et al. ............. 365/185.17 |
| 2001/0005616 | A1 | 6/2001 | Kim |
| 2001/0052610 | A1 | 12/2001 | Leung et al. |
| 2002/0009815 | A1 | 1/2002 | Sugihara et al. |
| 2002/0019114 | A1 | 2/2002 | Trivedi |
| 2002/0072197 | A1 | 6/2002 | Kang et al. |
| 2003/0006476 | A1 | 1/2003 | Chen et al. |
| 2003/0153148 | A1 * | 8/2003 | Chang ......................... 438/257 |

OTHER PUBLICATIONS

European Search Report for EP 03 10 4191 dated Nov. 5, 2004.

* cited by examiner

*Primary Examiner*—Bradley K Smith  
(74) *Attorney, Agent, or Firm*—Schwabe Williamson & Wyatt

(57) ABSTRACT

A process for self-aligned manufacturing of integrated electronic devices includes: forming, in a semiconductor wafer having a substrate, insulation structures that delimit active areas and project from the substrate; forming a first conductive layer, which coats the insulation structures and the active areas; and partially removing the first conductive layer. In addition, recesses are formed in the insulation structures before forming said first conductive layer.

16 Claims, 6 Drawing Sheets

PROCESS FOR SELF-ALIGNED MANUFACTURE OF INTEGRATED ELECTRONIC DEVICES

PRIORITY CLAIM

This application is a Divisional of prior application Ser. No. 10/713,518, filed Nov. 14, 2003 the benefit of the filing date of which is hereby claimed under 35 USC 120, which claims priority from Italian patent application No. TO2002A 000997, filed Nov. 15, 2002, which is incorporated herein by reference.

TECHNICAL FIELD

The present invention relates to a process for self-aligned manufacture of integrated electronic devices.

BACKGROUND

As is known, in modern microelectronics, reduction of the overall dimensions of devices is one of the main objectives. In particular, in the fabrication of memories of a non-volatile type, it is important to minimize the overall dimensions of each memory cell. The need to obtain an increasingly wider integration scale entails, however, certain difficulties. In some cases, for example, the alignment of the masks used in the different processing steps using traditional processes calls for a precision that, in practice, is frequently not possible to achieve. In particular, a major problem is to align the masks normally utilized, on the one hand, for defining the active areas accommodating the memory cells and, on the other, for shaping the polysilicon layer extending on top of the active areas and forming the floating gates of the cells.

So-called self-aligned processes have consequently been developed, and enable the more critical masking steps to be eliminated, exploiting the surface conformation of the wafer. For greater clarity, reference may be made to FIGS. 1 to 4, showing a semiconductor wafer 1 having a substrate 10, for example of monocrystalline silicon. The wafer 1 comprises conductive active areas 2, insulated by shallow-trench-insulation (STI) structures 3, or else, alternatively, by insulation structures formed through local oxidation of silicon (LOCOS). In practice, the insulation structures 3 comprise trenches of a preset depth, filled with silicon dioxide. In either case, the insulation structures 3 project from the surface 4 of the wafer 1, adjacent to the active areas 2; in this way, the insulation structures 3 define recesses 5 exactly on top of the active areas 2.

Channel regions of memory cells (not illustrated herein) are made inside the active areas 2 by implanting and diffusing dopant species and using thermal oxidation; then a thermal oxidation provides a gate oxide layer 7, of the thickness of a few nanometers. Subsequently, a conductive polysilicon layer 8 is deposited, as illustrated in FIG. 2.

The conductive layer 8 fills the recesses 5 and has a thickness such as to cover completely the projecting portions of the insulation structures 3.

Next (FIG. 3), a chemical-mechanical-polishing (CMP) planarization is performed, which is stopped when the insulation structures 3 are again exposed. In this way, the entire polysilicon layer 8 is removed, except for residual portions, which occupy the recesses 5 and are consequently perfectly aligned to the active areas 2. In practice, the residual portions of the polysilicon layer 8, which are insulated from the respective active areas 2 thanks to the oxide layer 7, form floating gates 11 of the memory cells.

The process further comprises forming an insulating layer 12, which coats the floating gates 11 of the polysilicon layer 8, and depositing a further polysilicon layer, which is in turn defined for forming control gates 13 of the memory cells.

The known self-aligned processes, although advantageous as regards the possibility of increasing the integration scale, present, however, other limitations. Traditional processes, in fact, enable passive components (normally resistors and capacitors) to be formed on top of the insulating structures. In particular, these components and floating gates of the memory cells may be formed starting from the same polysilicon layer using a single mask. This is particularly useful for forming parts of read/write circuits of the memory cells, which are normally integrated in the same wafer, but must withstand much higher voltages and currents. The gate oxide is in fact too thin for eliminating the inevitable capacitive coupling of the high-voltage passive elements with the substrate and is highly subject to breakdown if subjected to high voltages. In addition, traditional processes enable standard cells and high-performance cells to be formed in the same wafer. In particular, in the high-performance cells, the floating terminal is shaped so as to extend in part also outside of the active areas and is consequently better coupled to the control gate: these cells may consequently be driven more rapidly and/or with lower voltages.

It is, however, evident that known self-aligned processes do not enable either passive components or high-performance cells to be formed on top of the insulating structures. On the one hand, in fact, the CMP treatment removes completely the polysilicon overlying the insulating structures, where no conductive material is available to form electrical components; it is consequently necessary to depose and define a new polysilicon layer. On the other hand, precisely because the processes are self-aligned, the recesses where the floating gates of the cells are formed have the same dimensions as the underlying active areas and consequently it is not possible to improve the coupling.

SUMMARY

An embodiment of the present invention provides a self-aligned process for manufacturing integrated electronic devices, the process being free from the drawbacks described above.

BRIEF DESCRIPTION OF THE DRAWINGS

For a better understanding of the invention, some embodiments thereof are now described purely by way of non-limiting example and with reference to the attached drawings, wherein.

DETAILED DESCRIPTION

Figure 1:
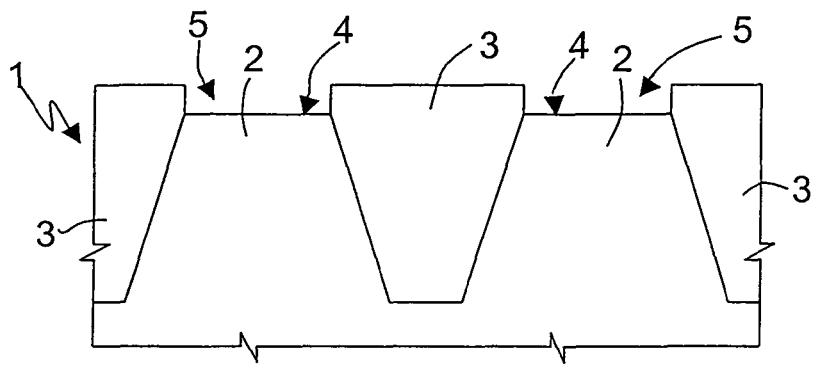
FIGS. 1 to 4 are cross-sectional views through a semiconductor wafer in successive fabrication steps of a process according to the prior art.
Figure 2:
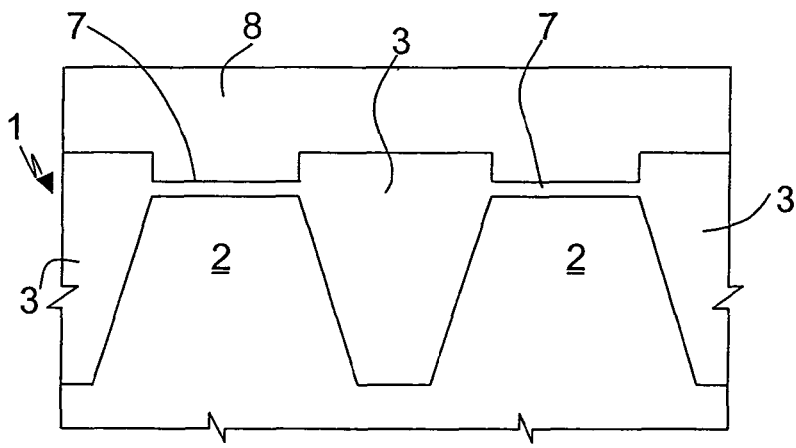
Figure 3:
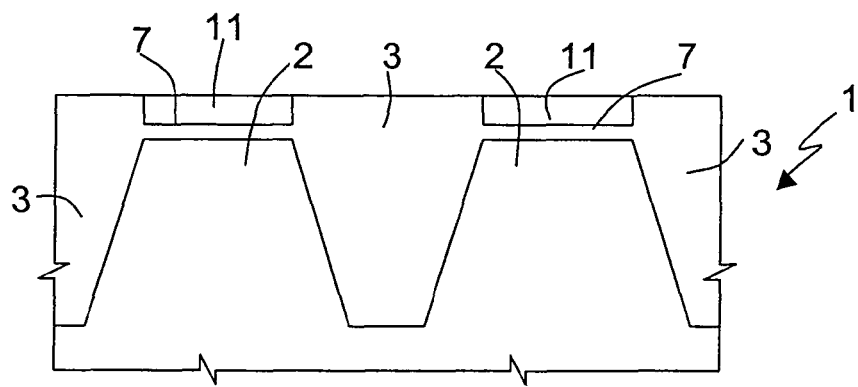
Figure 4:
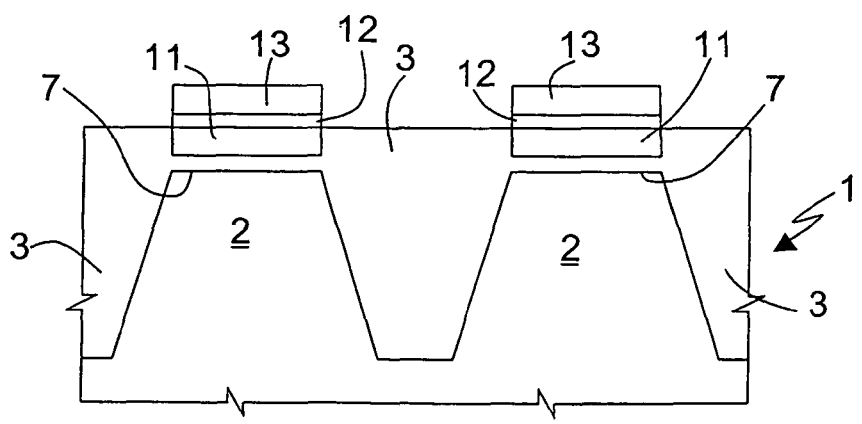
Figure 5:
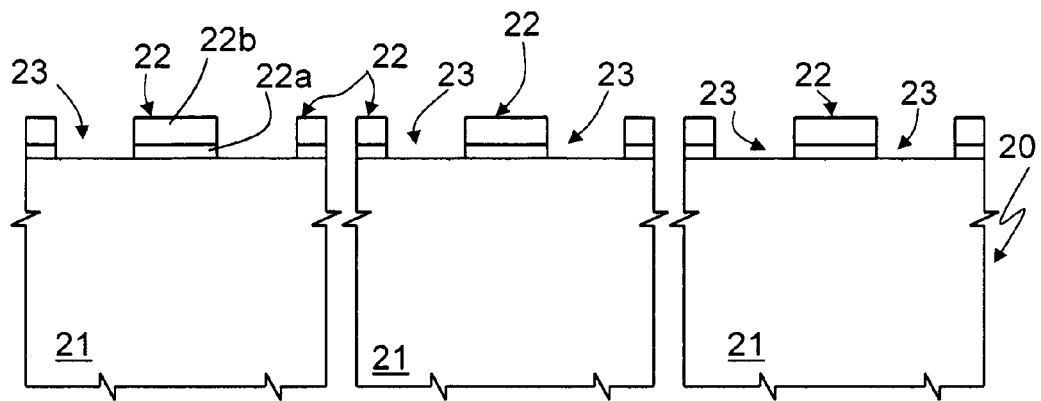
FIGS. 5 to 16 are a cross-sectional views through a semiconductor wafer in successive fabrication steps of a process according to a first embodiment of the present invention.
Figure 6:
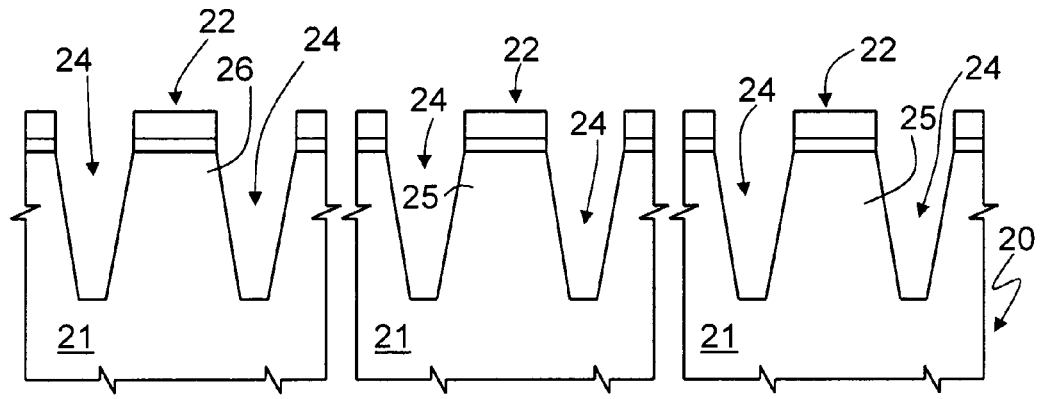

Hereinafter, the process according to an embodiment of the invention is described as being used to manufacture non-volatile memories, in particular of EEPROM or flash type;

this is not, however, to be considered limiting, in so far as the process may be used also in electronic devices of another type.

With reference to FIGS. 5 to 16, a semiconductor wafer 20, preferably of silicon, has a substrate 21, for example of P type. Initially, a hard mask 22 is formed on the wafer 20; the hard mask 22 comprises a pad oxide layer 22*a* and a silicon nitride layer 22*b* and has openings 23. Using the hard mask 22, the substrate 21 of the wafer 20 is etched, and trenches 24 are opened, which delimit memory active areas 25 and circuitry active areas 26, where memory cells and, respectively, read/write circuits and control circuits (FIG. 6) will subsequently be formed.

Figure 7:
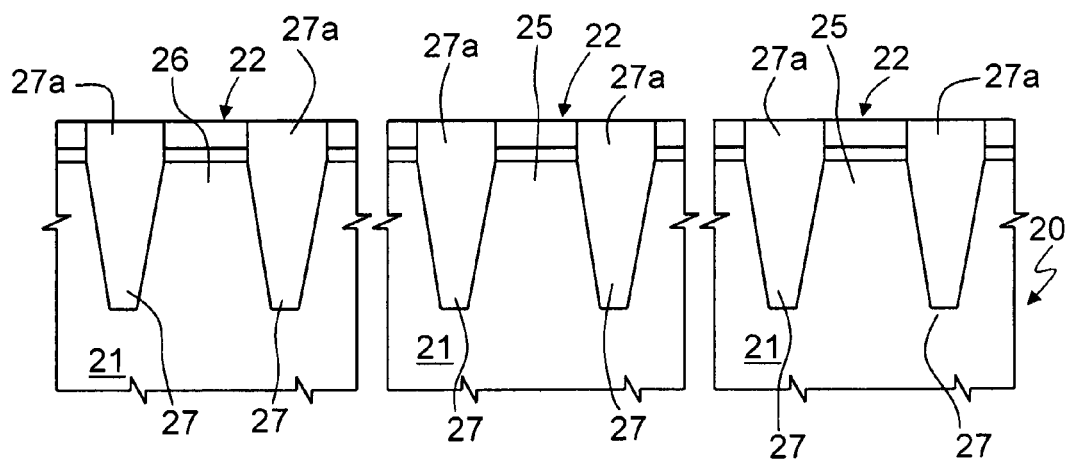

After a thermal-oxidation step, optimizing the profile of the trenches 24, the trenches 24 are filled with dielectric material, here silicon dioxide. The wafer 20 is then planarized with a first chemical-mechanical-polishing (CMP) treatment; in particular, the CMP treatment is interrupted when the hard mask 22 has been reached, as illustrated in FIG. 7. At this point, in practice, the active array areas 25 and circuitry-active areas 26 are delimited laterally by trench insulation structures 27, which extend in part inside the substrate 21 and have projecting portions 27*a* projecting at the top from the substrate 21 and aligned with the hard mask 22.

Figure 8:
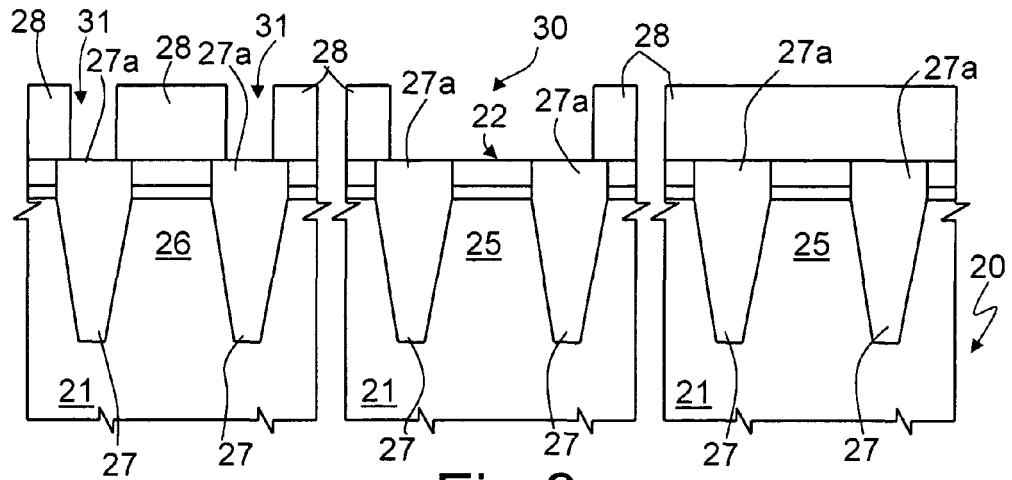

Subsequently, a resist mask 28 is formed on top of the wafer 20 and has first and second openings 30, 31 (see FIG. 8). In detail, the first openings 30 are formed on top of some of the memory active areas 25, where high-performance cells are to be formed. More precisely, the first openings 30 expose portions of the hard mask 22 that overlie these active memory areas 25 and, furthermore, laterally expose the projecting portions 27*a* of the insulation structures 27 adjacent to them. The second openings 31, instead, centrally expose the projecting portions 27*a* of the insulation structures 27, which delimit the circuitry active areas 26. The remaining memory active areas 25, designed to accommodate standard cells, are covered by the resist mask 28.

Figure 9:
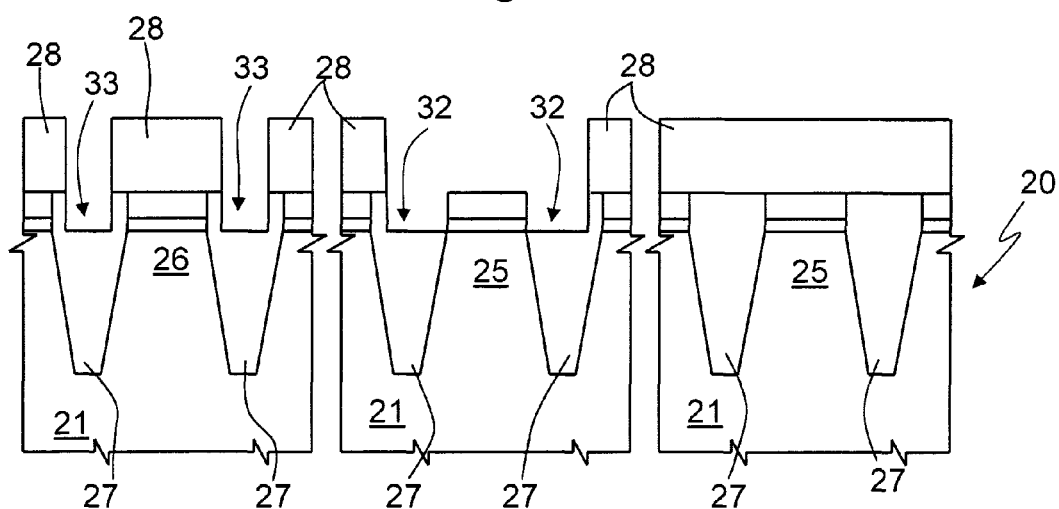

Then the exposed silicon-dioxide portions are etched in a controlled way, as illustrated in FIG. 9. In this step, in particular, first and second recesses 32, 33 are formed inside the insulation structures 27, which delimit the memory active areas 25 and, respectively, the circuitry active areas 26. In practice, the first recesses 32 are delimited at the bottom and on one side by the respective insulation structures 27 and, on the opposite side, by portions of the hard mask 22, which coat memory active areas 25. The second recesses 33 are, instead, formed completely inside the insulation structures 27, defining the circuitry active areas 26. In greater detail, the second recesses 33 are opened and accessible at the top and are delimited laterally and at the bottom by the respective insulation structures 27.

Figure 10:
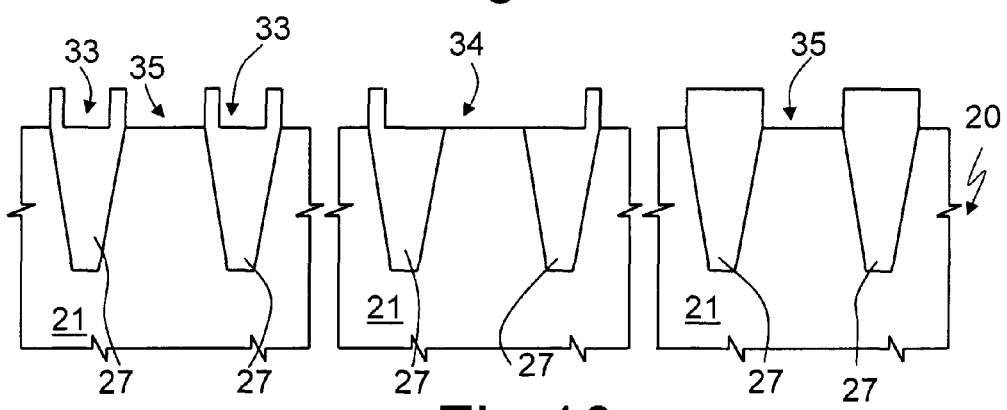

Next, the resist mask 28 and the hard mask 22 are removed, as illustrated in FIG. 10. At this point, in practice, the first recesses 32 are connected to one another and form, in pairs, cavities 34 above the respective memory active areas 25; furthermore, third recesses 35 are defined on top of the memory active areas 25 intended to accommodate standard memory cells, and are delimited laterally by pairs of insulation structures 27.

In a known way, ion-implantation and diffusion are then performed for forming channel regions of memory cells (not illustrated herein for convenience) in the memory active areas 25; simultaneously, electronic components are provided in the circuitry-active areas 26 and form read/write and control circuits 36, here indicated only schematically.

Figure 11:
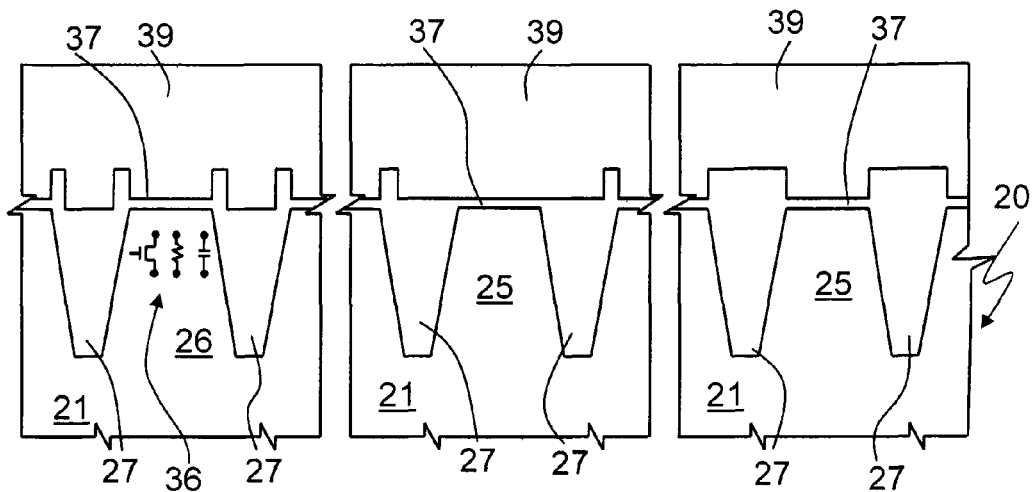

Subsequently, a gate oxide layer 37 with a thickness of a few nanometers is grown thermally, and coats both the memory active areas 25 and the circuitry active areas 26 (FIG. 11). A first polysilicon layer 39 is then deposited on the wafer 20, coats the entire wafer 20, and fills the second and third recesses 33, 35 and the cavities 34.

Figure 12:
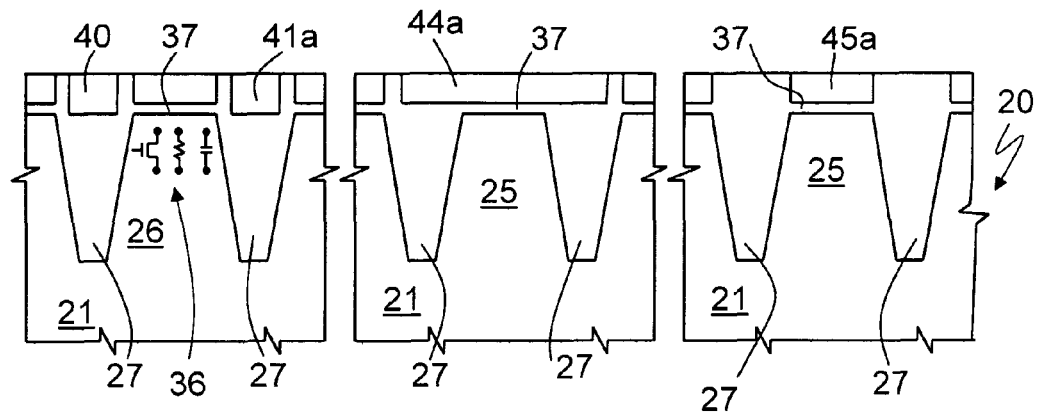
Figure 13:
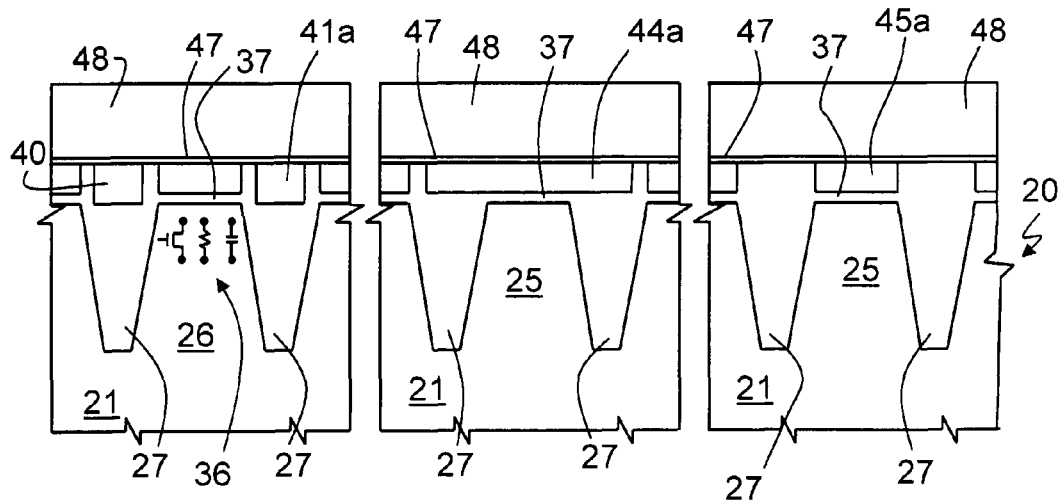
Figure 14:
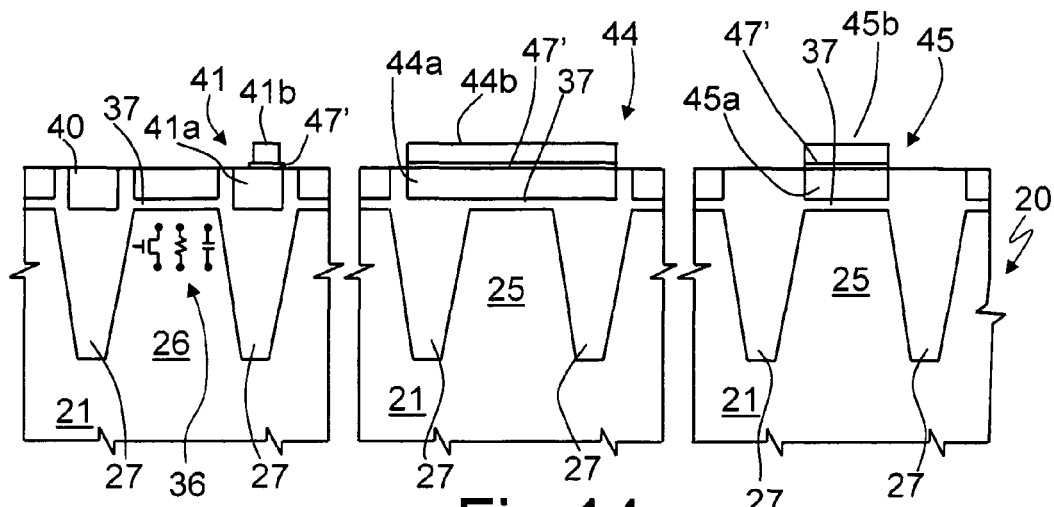

The wafer 20 is then planarized with a second CMP treatment, which is stopped when the insulation structures 27 are again exposed, as illustrated in FIG. 12. In this step, the first polysilicon layer 39 is removed completely, except for residual portions inside the second recesses 33, the cavities 34 and the third recesses 35, which form, in the first case, resistors 40 and first plates 41*a* of capacitors, and in the other cases, floating gates 44*a*, 45*a* of high-performance memory cells and standard memory cells, respectively. In this way, in practice, just one deposition of polysilicon, followed by a planarization step, enables conductive regions to be formed which extend entirely (resistors 40 and first plates 41*a*) or partially (floating gates 44*a*) on top of insulation structures 27. The steps described above are moreover self-aligned, in so far as they are formed by exploiting the surface conformation of the wafer 20.

Then a dielectric layer 47 and a second polysilicon layer 48 are deposited (FIG. 13) and selectively etched for forming capacitors 41, high-performance cells 44, and standard cells 45. In particular, referring to FIG. 14, starting from the second polysilicon layer 48, second plates 41*b* are formed on top of the first plates 41*a*, and control gates 44*b*, 45*b* are formed on top of the floating gates 44*a*, 45*a* of high-performance cells 44 and standard cells 45, respectively. In addition, the second plates 41*b* and the control gates 44*b*, 45*b* are insulated from the underlying conductive regions (first plates 41*a*, floating gates 44*a*, 45*a*) by respective residual portions 47 of the dielectric layer 47. Clearly, the floating gates 44*a* and control gates 44*b* of the high-performance cells have a greater capacitive coupling than those of the standard cells, since they have a larger surface. They extend, in fact, beyond the respective active areas 25 and occupy the first recesses 32 of the adjacent insulation structures 27.

Figure 15:
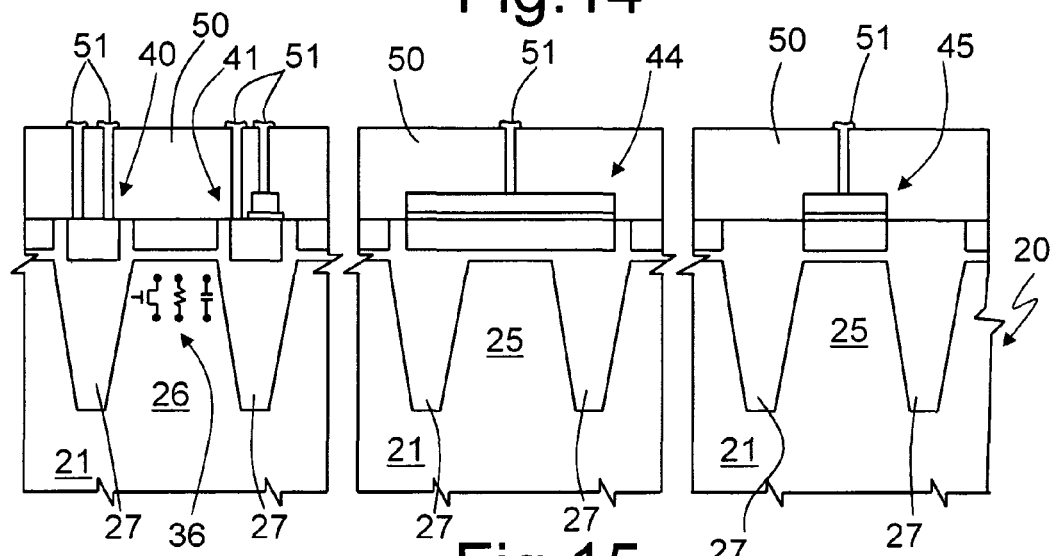
Figure 16:
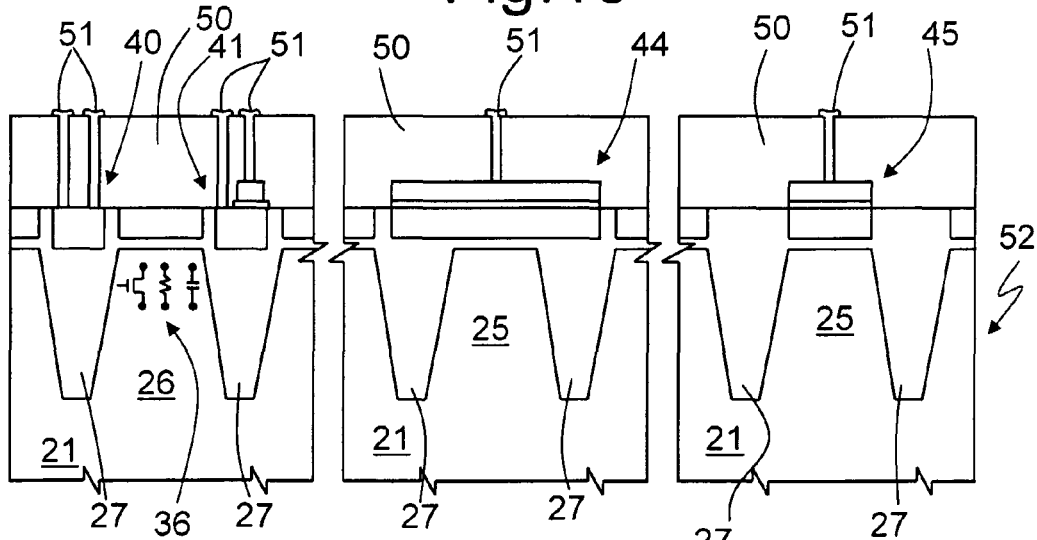

Referring to FIG. 15, the process then comprises depositing a protective dielectric layer 50, for example of silicon dioxide, and opening contacts 51 through the protective layer 50. Finally, the wafer 20 is divided into individual dice 52, as illustrated in FIG. 16; each die 52 comprises a respective electronic device, which, in the described embodiment, is a non-volatile memory.

The process according to the above-described embodiment of the invention is clearly advantageous, because, through the addition of just one masked etch of the insulation structures 27, it enables both passive components presenting excellent insulation from the substrate 21 and memory cells with differentiated characteristics and performance to be formed on the same wafer 20.

In particular, the passive components (resistors 40 and capacitors 41) may operate with high voltages, without any risk of breakdown of the insulating dielectric and, furthermore, with a substantially negligible capacitive coupling to the substrate 21. These components are consequently suited for being used in read/write circuits, for example for forming charge pumps. As regards, instead, the memory cells, the process enables cells with high capacitive coupling between the control gate and the floating gate to be formed, in addition to the standard cells.

In this case, the high capacitive coupling is useful because the memory cells formed in this way may be driven with low voltages and hence have optimized performance. Memory cells of this type are particularly advantageous in the case of so-called "embedded" memories, which also integrate highcomplexity logic circuits, such as, for example, microcontrollers or digital signal processors (DSPs).

In addition, the definition of the resist mask 28 for etching the insulation structures 27 is not critical and does not present problems of alignment with the active areas. Finally, the process is self-aligned and consequently enables standard cells of extremely contained dimensions to be formed.

Figure 17:
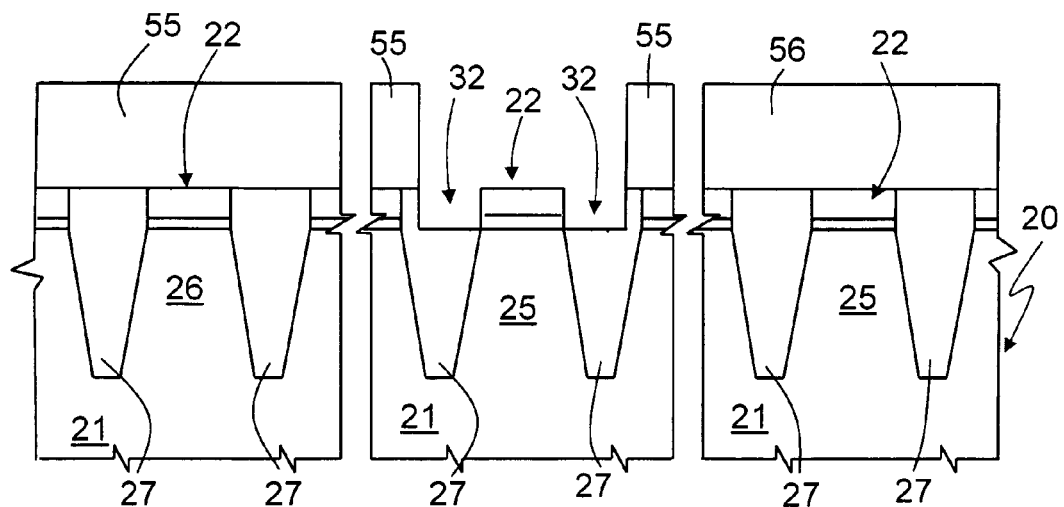
FIGS. 17 and 18 are cross-sectional views through a semiconductor wafer in successive fabrication steps of a process according to a different embodiment of the present invention.
Figure 18:
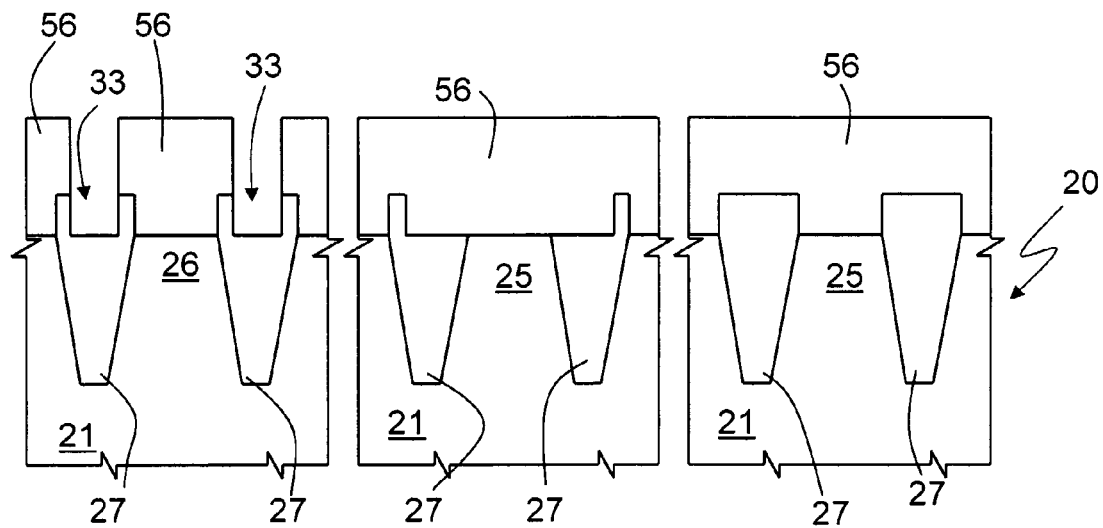

FIGS. 17 and 18, where parts equal to those already illustrated are designated by the same reference numbers, show a different embodiment of the process according to the invention. In this case, after the insulation structures 27 have been formed and the wafer 20 has been planarized via the first CMP treatment, as already described previously, a first resist mask 55 is deposited and defined, to expose only a part of insulation structures 27 delimiting memory active areas 25; the insulation structures which delimit the circuitry-active areas 26 are instead protected (FIG. 17). By a first controlled etch, the first recesses 32 are then formed.

After the first resist mask 55 and the hard mask 22 have been removed, a second resist mask 56 is formed on top of the wafer 20. Now, all the memory active areas 25 and the respective insulation structures 27 are protected, while central portions of the insulation structures, which delimit the circuitry-active areas 26, are left exposed. The wafer 20 is again etched in a controlled way, and the second recesses 33 are formed. The second resist mask 56 is then removed, and the procedure ends with deposition of the first polysilicon layer 39, second CMP treatment, and formation of passive components and memory cells, as already described with reference to FIGS. 11 to 16.

Thereby, the process enables recesses having a differentiated depth to be formed. In particular, it is possible to control the first etch, which is often more critical, with greater precision. The first recesses 32, in fact, typically must accommodate a polysilicon layer of thickness sufficient for withstanding the CMP treatment without undergoing damage, but at the same time typically must never have a depth such as to uncover the memory active areas 25. According to the design specifications of the individual storage device, instead, it could be convenient to form second deeper recesses 33.

Finally, it is evident that modifications and variations may be formed to the process described, without thereby departing from the scope of the present invention. In particular, the steps of masked etching for opening the first and second recesses 32, 33 may be performed either before or after removal of the hard mask 22. The first recesses 32 could be formed also only in the insulation structures 27 which delimit one side of the memory-active areas 25, and not in those which delimit the other sides; in practice, for each memory-active area, only a first recess 32 is defined. In addition, the storage devices obtained according to the above-described processes need not necessarily comprise both passive components formed on top of the insulation structures and high-performance memory cells; instead, the process may also be exploited for forming only resistors, only capacitors, or else only high-performance memory cells. Finally, as already mentioned previously, the process may also be used for forming devices other than non-volatile memories, such as for example volatile memories.

From the foregoing it will be appreciated that, although specific embodiments of the invention have been described herein for purposes of illustration, various modifications may be made without deviating from the spirit and scope of the invention.

What is claimed is:

1. A method for self-aligned manufacturing integrated electronic devices, comprising:
   forming, in a semiconductor wafer having a substrate, insulation structures delimiting active areas and projecting from said substrate;
   forming recesses in said insulation structures;
   after forming said recesses in said insulation structures, forming a first conductive layer coating said insulation structures and said active areas; and
   partially removing said first conductive layer, including forming first conductive regions and second conductive regions; and
   after partially removing said first conductive layer:
     forming a dielectric layer on top of said wafer;
     forming a second conductive layer on top of said dielectric layer; and
     selectively removing said dielectric layer and said second conductive layer;
   wherein said selectively removing comprises forming third conductive regions.

2. The method of claim 1 wherein said forming said first conductive layer comprises filling said insulation structures.

3. The method of claim 1 wherein said forming recesses comprises removing side portions of said insulation structures so as to form first recesses.

4. The method of claim 3 wherein said first recesses are defined on top and at the side of respective ones of said active areas.

5. The method of claim 3 wherein said first conductive regions extend inside at least one of said first recesses and on top of a respective said active area.

6. The method of claim 1 wherein said second conductive regions comprise floating gates of respective memory cells.

7. The method of claim 1 wherein said forming recesses comprises removing central portions of said insulation structures so as to form second recesses, and wherein said second conductive regions are accommodated inside respective ones of said second recesses.

8. The method of claim 7 wherein said second recesses are delimited by respective ones of said insulation structures.

9. The method of claim 7 wherein said third conductive regions are accommodated inside respective ones of said second recesses.

10. The method of claim 1 wherein said third conductive regions comprise resistors.

11. The method of claim 1 wherein said third conductive regions comprise first plates of respective capacitors.

12. The method of claim 11, wherein said third conductive regions comprise second plates of said capacitors.

13. The method of claim 1 wherein said forming recesses comprises performing at least one first masked etch of said insulation structures.

14. The method of claim 13 wherein said forming recesses comprises performing a second masked etch of said insulation structures.

15. The method of claim 1 wherein said partially removing comprises planarizing said wafer.

16. The method of claim 1 wherein said first conductive regions comprise floating gates of respective first memory cells, and wherein said third conductive regions comprise control gates of said memory cells.

* * * * *